US006777771B1

(12) United States Patent
Marumoto et al.

(10) Patent No.: US 6,777,771 B1
(45) Date of Patent: Aug. 17, 2004

(54) HIGH-FREQUENCY DEVICE USING SWITCH HAVING MOVABLE PARTS, AND METHOD OF MANUFACTURE THEREOF

(75) Inventors: Tsunehisa Marumoto, Tokyo (JP); Ryuichi Iwata, Tokyo (JP); Youichi Ara, Tokyo (JP); Hideki Kusamitsu, Tokyo (JP); Kenichiro Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/958,377

(22) PCT Filed: Apr. 6, 2000

(86) PCT No.: PCT/JP00/02219

§ 371 (c)(1), (2), (4) Date: Oct. 9, 2001

(87) PCT Pub. No.: WO00/60699

PCT Pub. Date: Oct. 12, 2000

(30) Foreign Application Priority Data

Apr. 6, 1999 (JP) .......................................... 11/098823

(51) Int. Cl.[7] ................................................ H01L 29/00
(52) U.S. Cl. ........................ 257/500; 257/921; 257/923
(58) Field of Search ................................. 257/500, 921, 257/923

(56) References Cited

U.S. PATENT DOCUMENTS 5,116,807 A * 5/1992 Romanofsky et al. ...... 505/181
5,488,380 A * 1/1996 Harvey et al. .............. 342/368
5,757,074 A * 5/1998 Matloubian et al. ........ 257/702
5,757,319 A * 5/1998 Loo et al. ................... 342/357
6,016,092 A * 1/2000 Qiu et al. ................... 333/262
6,057,600 A * 5/2000 Kitazawa et al. ........... 257/728
6,075,239 A * 6/2000 Aksyuk et al. ............. 250/229
6,133,807 A * 10/2000 Akiyama et al. ........... 333/101
6,148,221 A * 11/2000 Ishikawa et al. ............ 505/210
6,388,623 B1 * 5/2002 Sakota et al. ........ 343/700 MS

FOREIGN PATENT DOCUMENTS

| | | |
|---|---|---|
| JP | 1-290301 | 11/1989 |
| JP | 3-182103 | 8/1991 |
| JP | 8-287809 | 11/1996 |
| JP | 11-74717 | 3/1999 |

OTHER PUBLICATIONS

S. Ohmori et al., "A Phased Array Tracking Antenna for Vehicles," The Institute of Electronics, Information and Communication Engineers Technical Report No. AP 90–75, pp. 33–40.

* cited by examiner

*Primary Examiner*—Amir Zarabian
*Assistant Examiner*—Ida M. Soward
(74) *Attorney, Agent, or Firm*—Young & Thompson

(57) ABSTRACT

A method of manufacturing a high-gain, high-frequency device, such as a phased-array antenna, which uses such a switch having movable parts as a micromachine switch. The high-frequency device comprises a dielectric substrate on which are formed a plurality of waveguides for carrying high-frequency signals, a phase control layer, and dielectric spacers arranged between the phase control layer and another layer to provide space in which a switch formed in the phase control layer is enclosed.

15 Claims, 8 Drawing Sheets

HIGH-FREQUENCY DEVICE USING SWITCH HAVING MOVABLE PARTS, AND METHOD OF MANUFACTURE THEREOF

TECHNICAL FIELD

The present invention relates to a high-frequency device, such as a phased array antenna, for transmitting high-frequency signals, which is used to transmit and receive high-frequency signals such as a microwave, and relates to a method of manufacturing the same. More particularly, the invention relates to a high-gain high-frequency device which can be applied to a high-frequency band and which has such a switch having movable parts as a micromachine switch, and relates to a method of manufacturing the same.

BACKGROUND ART

Conventionally, a phased array antenna which is used as a vehicle-installed satellite tracing antenna or a satellite-installed antenna, and in which a large number of radiating elements are disposed is proposed in, for example, The Institute of Electronics, Information and Communication Engineers Technical Report No. AP 90-75, and Japanese Unexamined Patent Publication No. 1-290301.

This type of phased array antenna has a function for arbitrarily varying the direction of a beam by changing the phase of feeding power to each radiating element.

As means for varying the phase of feeding power is generally used a digital phase shifter (hereinafter, abbreviated as a phase shifter) composed of a plurality of phase-shifting circuits each having a different fixed amount of phase shift. In the phased array antenna, each phase-shifting circuit is turned on or off by a 1-bit digital control signal and the amount of phase shift in each phase-shifting circuit is combined with each other. By combining the amount of the phase shift, power-feeding phases of 0 to 360° can be obtained in the whole phase sifter Particularly, in the conventional phased array antenna, a large number of semiconductor elements such as a PIN diode and a GaAsFET are used as switching elements in each phase-shifting circuit, and a large number of driving circuit parts are used to drive such elements. The phase shifter has a structure for generating a predetermined amount of phase shift by applying a direct current or a direct voltage to the switching elements to turn on/off, and by varying the length of a transmission path, susceptance, a reflection coefficient, and the like.

On the other hand, recently, high-data-rate communication is required in the field of low-Earth-orbiting satellite communication, because of an increase in the use of the Internet, and wide spread use of multimedia communication. Accordingly, it is required to obtain a high-gain antenna. Also, it is required to increase a transmission bandwidth in order to achieve communication at a high data rate. Furthermore, because of a deficiency of frequency resources at a low frequency band, it is required to rapidly realize an antenna which can be applied at a high-frequency band of Ka band (20 GHz or more).

Specifically, as an antenna of a low-Earth-orbiting satellite tracing terminal at a ground station, the following technical performances are required:

Frequency: 30 GHz

Isotropic gain of the antenna: 36 dBi

Beam scanning range: Beam tilt angle of 50° from the front

In order to achieve the above by a phased array antenna, first, an opening area of about 0.13 $m^2$ (360 mm×360 mm) is required. Moreover, in order to reduce side lobes, it is necessary to avoid the generation of grating lobes by arranging radiating elements at intervals of about ½ wavelength (about 5 mm at 30 GHz).

Also, in order to divide a beam scanning step into a number of steps and to reduce the degradation of side lobes arising from a quantization error of the digital phase shifter, it is preferable that phase-shifting circuits used for each phase shifter be of 4 bits. (minimum bit phase shifter of 22.5° or more.

The total number of radiating elements and the bits of the phase-shifting circuits which are used for a phased array antenna that satisfies the above conditions are as follows:

The number of phase-shifting circuit elements: 72×72= about 5000.

The number of bits of phase-shifting circuits: 72×72×4= about 20000 bits.

Here, when a high-gain phased array antenna which can be applied to such a high-frequency band is achieved by the aforesaid conventional art, for example, a phased array antenna disclosed in Japanese Unexamined Patent Application Publication No. 1-290301, which is shown in FIG. 1, the following problems are posed:

In such a conventional phased array antenna, since individual phase-shifting circuits in each phase shifter 13 are controlled by one driver circuit 12 formed on a driving circuit substrate 11, as shown in FIG. 1, it is necessary to connect the driver circuit 12 with all the phase-shifting circuits individually. Accordingly, the number of wires for connection is required to correspond to a value obtained by the expression: the number of radiating elements×the number of bits of phase-shifting circuits. When the aforesaid values are applied, the number of wires for each phase-shifting circuit (4 bits) of one row (72 radiating elements) in a radiating-element array of 72×72 is obtained by the equation, 72×4=288.

When such a wiring is formed on the same plane, even when the equation, the width (L) of wiring+the space (S) of wiring=50 $\mu$m+50 $\mu$m=0.1 mm, is satisfied, the width of bundle wires of one row (72 of radiating elements) is obtained by the equation, 0.1 mm×288=28.8 mm.

On the other hand, in the phased array antenna which can be applied to a frequency of 30 GHz, the radiating elements are required to be arranged with a space of about 5 mm; as described above. However, in the conventional art, the width of the bundle wires is as long as 28.8 mm, as described above, which is significantly thick, so that it is physically impossible to arrange them.

In this case, when not only layers (a radiating element substrate 21 and a parasitic element substrate 31) in which the radiating elements 22, 32 are formed, but also a distribution/combination device 14 and the phase shifters 13 are each formed on a different layer, only the phase shifters 13 can be freely arranged on a layer on which the phase shifters 13 are to be formed. Consequently, the aforesaid problems of arrangement can be solved. Accordingly, with a multilayer structure, a phased array antenna which is more applicable to a high-frequency band can be achieved. With such a multilayer structure, since the thickness of each layer is so small as to be a few millimeters, it is not so thick. Thus, the phased array antenna can be of a small area, so that it is particularly advantageous to install on a satellite or the like.

In the aforesaid high-frequency device, it has been examined to use a micromachine switch which is a micro mechanical switching element as a switching element used for switching an amount of phase shift in the phase shifter. However, with the foregoing multilayer structure, conventionally, since the space between the layers was filled with a dielectric substance, the micromachine switch having movable parts could not be used for the phase shifters formed on a layer arranged in between.

In other words, conventionally, when the high-frequency device such as a phased array antenna has multilayer structure, since the micromachine switch cannot be used as a switching element used in the phase shifters, it is not preferable.

The present invention is made to solve the above problems, and i is an object of the invention to provide a high-gain high-frequency device, such as a phased array antenna, which is applied to a high frequency band, and which can use such a switch having movable parts as a micromachine switch, and to provide a method of manufacturing the same.

DISCLOSURE OF INVENTION

The present invention relates to a high-frequency device including a substrate, a plurality of waveguides, a switch, a structure, a coupling layer, a separating layer, high-frequency parts, and control means, which will be described below. The substrate is made of a dielectric substance, and the plurality of waveguides is formed on the dielectric substrate and carries high-frequency signals. The switch has movable parts for switching connections of the waveguides formed on the substrate. The structure is disposed on the substrate and has a space above the area where the switch is formed. The coupling layer is made of a conductive material, is formed on the structure, and has coupling means for coupling the high-frequency signals on a predetermined area of the waveguides. The separating layer is made of a dielectric material formed on the coupling layer. The high-frequency parts are formed on the separating layer, in which the high-frequency signals are coupled between it and the waveguides via the coupling means. The control means controls the operation of the switch. As configured above, the switch can perform the operation of connection/disconnection in the space of the structure by being controlled by the control means.

In such a configuration, the structure may be made up of a plurality of spacers. At that time, the spacers may be made of a dielectric substance and may be disposed at the part of the coupling means. Also, the spacers may be formed of a conductive substance and may be arranged such that they are insulated from the waveguides. The structure may be formed of an integrated plate having a space therein. Also, a phase shifter may be formed of the waveguides and switches. In this case, the high-frequency parts are formed of radiating elements and the waveguides have a distributor for introducing a desired high frequency, thereby configuring a high-frequency device such as a phased array antenna.

In the process of manufacture according to the present invention, first, the plurality of waveguides for carrying the high-frequency signals on the dielectric substrate is formed. In the step, the switch having the movable parts for switching connections of the waveguides of the phased array antenna is formed on the substrate. Also, in the step, the structure having a space above the area at which the switch is formed is formed on the substrate. The coupling layer made of a conductive material and having the coupling means for coupling the high-frequency signals is formed on the structure such that the coupling means is placed on a predetermined area of the waveguides. Next, the separating layer made of a dielectric material is formed on the coupling layer. Also, the high-frequency parts in which the high-frequency signals are coupled between them and the waveguides via the coupling means are formed on the separating layer. The control means for controlling the operation of the switch is formed.

Accordingly, a state in which the switch having the movable parts controlled by the control means performs the operation of connection/disconnection is created.

Another high-frequency device according to the present invention includes an inner layer substrate forming a multilayer substrate, a plurality of waveguides, a switch, and a structure. The plurality of waveguides is formed on a main surface of the aforesaid inner layer substrate and carries high-frequency signals. The switch has movable parts for switching connections of the waveguides formed on the main surface of the inner layer substrate. The structure is disposed between the main surface of the inner layer substrate and a substrate disposed thereon and has a space above the switch-formed area.

As constructed above, the switch having the movable parts preforms the operation of connection/disconnection in the space of the structure. It is desirable to form the structure with a plurality of spacers. Also, it is preferable that the spacers be made of dielectric substance and may be disposed at the part of the coupling means. On the other hand, the spacers may be made of a conductive substance and may be arranged such that they are insulated from the waveguides. The structure may be made of an integrated plate having a space formed therein.

BRIEF DESCRIPTION OF THE DRAWINGS

FIG. 2(*b*) is a sectional view showing a structure of a switch portion in FIG. 2(*a*);

FIG. 2(*c*) is a top plan view of a substrate, showing the partial structure in FIG. 2(*a*);

FIG. 4(*b*) is a sectional view showing a structure when an intermediate step in the process of manufacture following FIG. 4(*a*) is finished;

FIG. 4(*c*) is a sectional view showing a structure when an intermediate step in the process of manufacture following FIG. 4(*b*) is finished;

FIG. 4(*d*) is a sectional view showing a structure when a step of manufacture following FIG. 4(*c*) is finished;

FIG. 6(*b*) is a sectional view showing a structure when an intermediate step in the process of manufacture following FIG. 6(*a*) is finished;

FIG. 6(*c*) is a sectional view showing a structure when a step of manufacture following FIG. 6(*b*) is finished;

FIG. 9(*b*) is a sectional view showing a structure when an intermediate step in the process of manufacture following FIG. 9(*a*) is finished;

FIG. 9(*c*) is a sectional view showing a structure when an intermediate step in the process of manufacture following FIG. 9(*b*) is finished;

FIG. 9(*d*) is a sectional view showing a structure when a step of manufacture following FIG. 9(*c*) is finished;

FIG. 10(*b*) is a sectional view showing a structure when a step of manufacture following FIG. 10(*a*) is finished.

BEST MODE FOR EMBODYING THE INVENTION

The present invention will be more specifically described with reference to the attached drawings.

FIRST EMBODIMENT

First, a first embodiment of the present invention will be described. Here, a phased array antenna having a band of 30 GHz will be described as an example of a high-frequency device with reference to FIG. 2.

Figure 1:
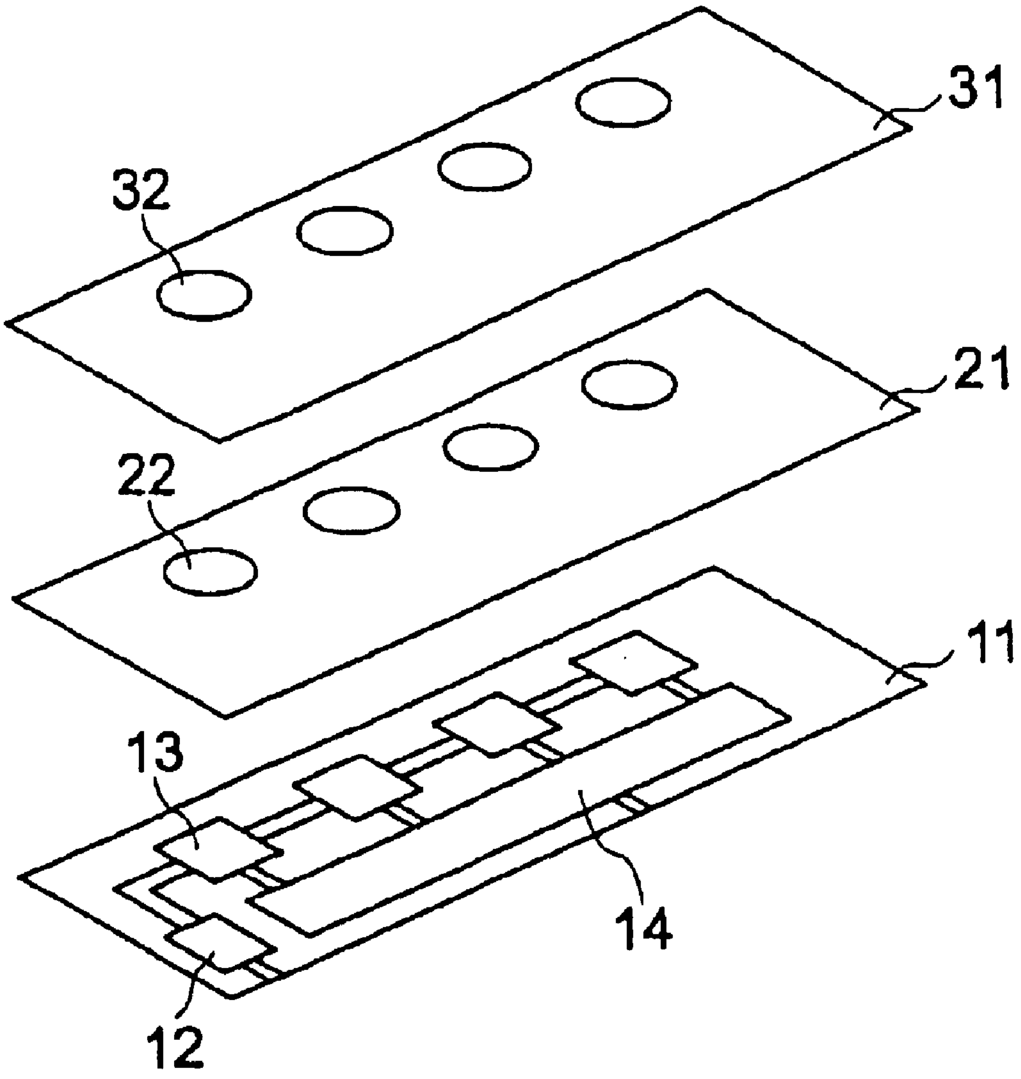
FIG. 1 PRIOR ART
FIG. 1 is a perspective view showing a simple structure of a conventional phased array antenna.
Figure 2A:
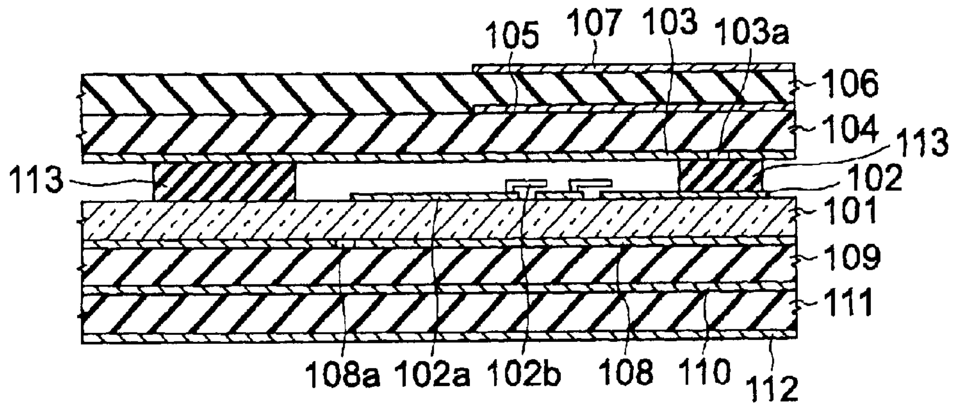
FIG. 2(*a*) is a sectional view showing a partial structure of a phased array antenna as a high-frequency device according to a first embodiment of the present invention.
Figure 2B:
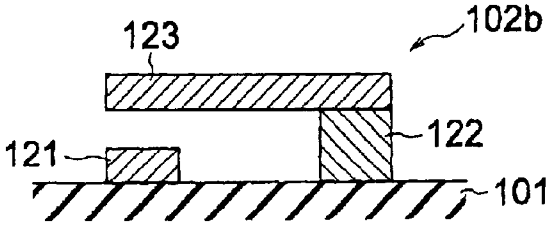
Figure 2C:
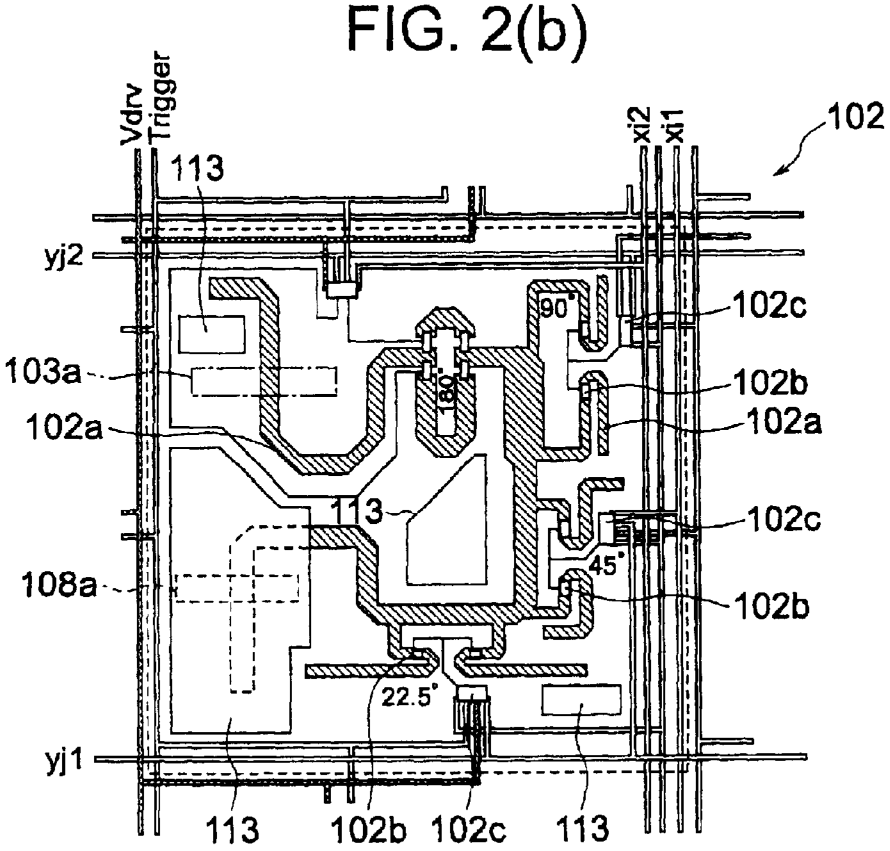

In the first embodiment, the phased array antenna is formed to have a multilayer structure, as shown in a sectional view of FIG. 2(*a*). In other words, first, a phase control layer 102 formed of a plurality of phase shifting units is formed on a substrate 101 made of a dielectric substance such as glass to control the phase of high-frequency signals using microstrip lines 102*a* serving as a waveguide, a micromachine switch 102*b* serving as a switch. The micromachine switch 102*b* includes a fixed electrode 121 and a movable electrode 123 supported by a pillar 122, as shown in FIG. 2(*b*), in which control means (not shown) controls the operation of the movable electrode 123, and connects/disconnects the fixed electrode 121 and the movable electrode 123, thereby performing ON/OFF operation.

On the phase control layer 102 is disposed a radiating element layer 105 in which a plurality of radiating elements is formed via a coupling layer 103 having coupling slots 103*a* serving as coupling means and a separating layer 104. A parasitic element layer 107 in which a plurality of parasitic elements is formed thereon is placed thereon via a separating layer 106. The parasitic elements are added to provide a wide band, and they may be configured as necessary.

On the other hand, a distribution/combination layer 110 including a microstrip line is disposed at the back of the substrate 101 via a coupling layer 108 having coupling slots 108*a* and a separating layer 109. The distribution/combination layer 110 distributes high-frequency signals carried from a power feeding section (not shown) to each phase shifting unit at the upper layer. Furthermore, in the embodiment shown in FIG. 2, a grounding layer 112 made of a conductive material is provided under the distribution/combination layer 110 via a separating layer 111 made of a dielectric substance. Such a separating layer 111 and a grounding layer 112 are added to reduce unnecessary copying from the distribution/combination layer 110, and which may be arranged as necessary.

The phase control layer 102 is constructed in such a manner that it switches the microstrip lines 102*a* each having a different length by plurality of micromachine switches 102*b*, as shown in a plan view of FIG. 2(*c*). FIG. 2(*c*) shows a cell portion that makes up the phased array antenna which is a high-frequency device, in which signal lines Xi1 and Xi2 coming out of a signal-line selecting section (not shown), scanning lines Yj1 and Yj2 coming out of a scanning-line selecting section (not shown), a trigger signal line Trg coming out of a controller (not shown), and a switch driving source line Vdrv are arranged at the periphery of the cell.

The micromachine switches 102*b* are driven by driving circuits 102*c* which connect to the signal lines as control means. The aforesaid microstrip lines 102*a* are configured in such a manner that they connect the upper part of the coupling slots 108*a* to the lower part of the coupling slots 103*a*.

Also, phase-shifting circuits of, for example, 22.5°, 45°, 90°, and 180° in angle are configured on the microstrip lines 102*a*, and are switched by the micromachine switches 102*b*, thereby shifting the phase of a high frequency to be guided to a desired value.

In this first embodiment, spacers 113 made of a dielectric material are disposed between the phase control layer 102 and an upper layer thereof, thereby providing a space above the area of the phase control layer 102 where the micromachine switches 102*b* are formed. In this case, the spacers 113 are arranged between the phase control layer 102 and the coupling layer 103 with a spacing of about 0.2 mm. In other words, a movable space for the micromachine switches 102*b* is ensured by the spacers 113, and also a sufficient distance to carry the high frequency on the microstrip lines 102*a* without any problems is ensured.

Here, the over all structure of the phased array antenna will be briefly described.

Figure 3:
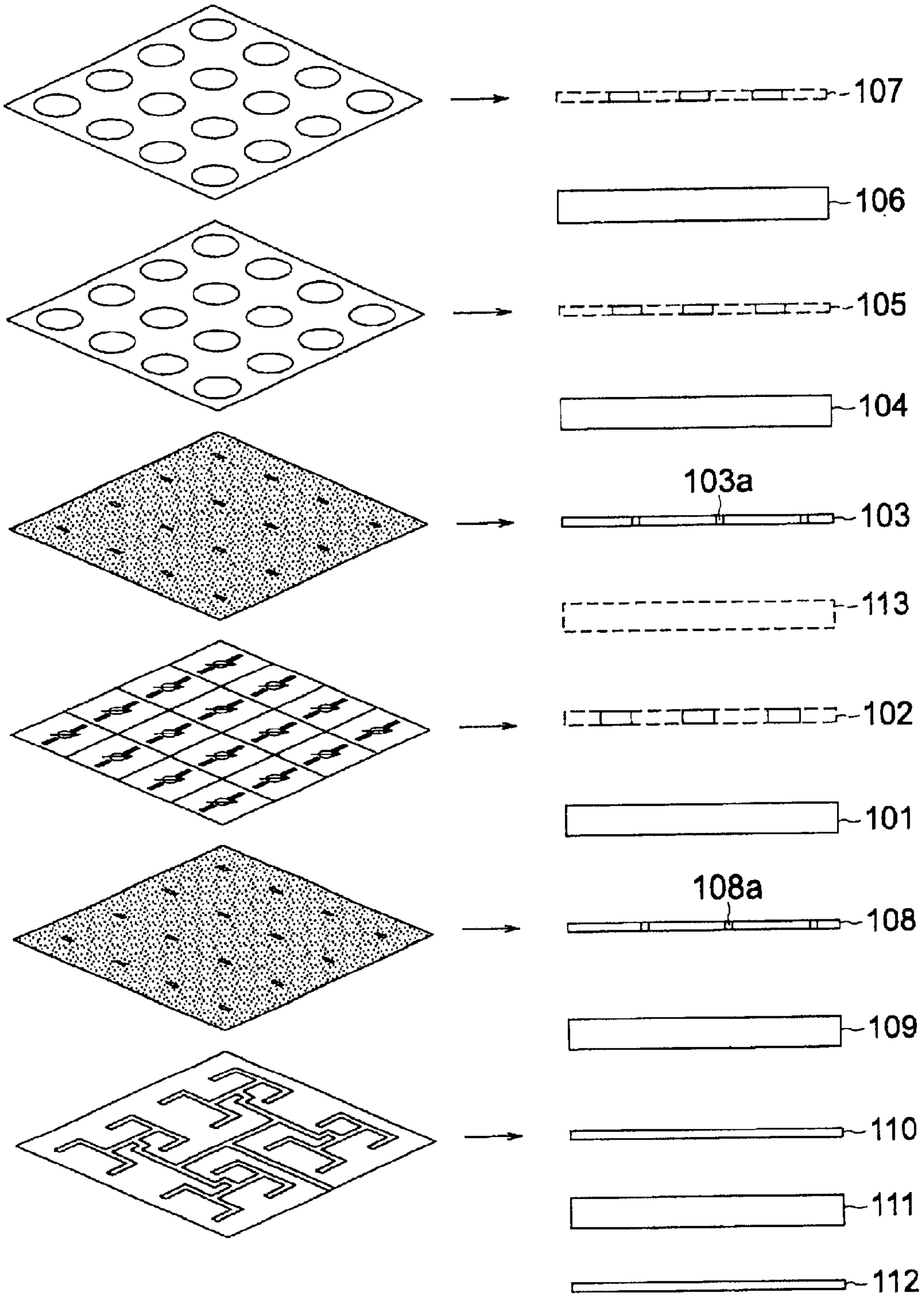
FIG. 3 is a combined view of a perspective view and a sectional view showing a structure of a high-frequency device according to the first embodiment.
Figure 4A:
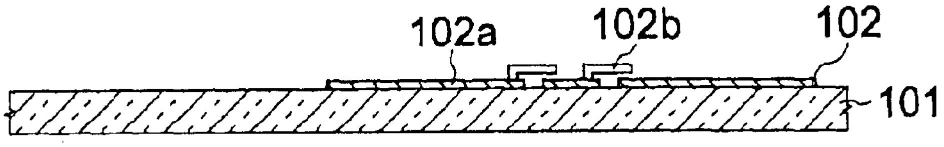
FIG. 4(*a*) is a sectional view showing a structure of the high-frequency device according to FIG. 2(*a*), when an intermediate step in the process of manufacture is finished.
Figure 4B:
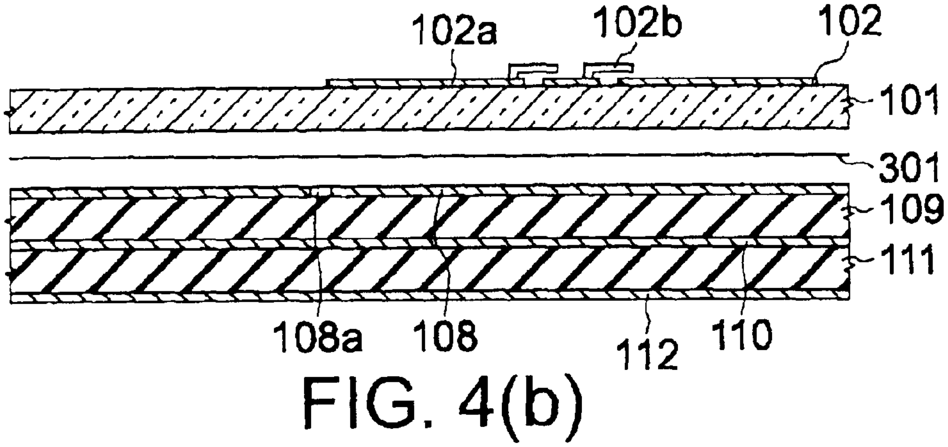
Figure 4C:
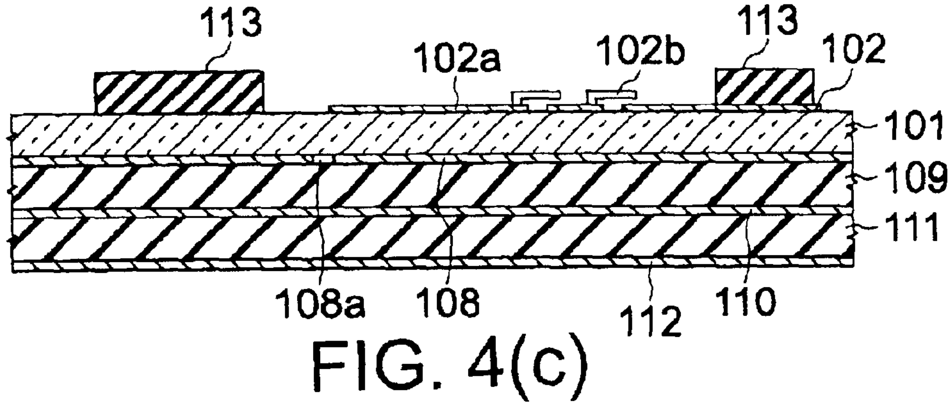
Figure 4D:
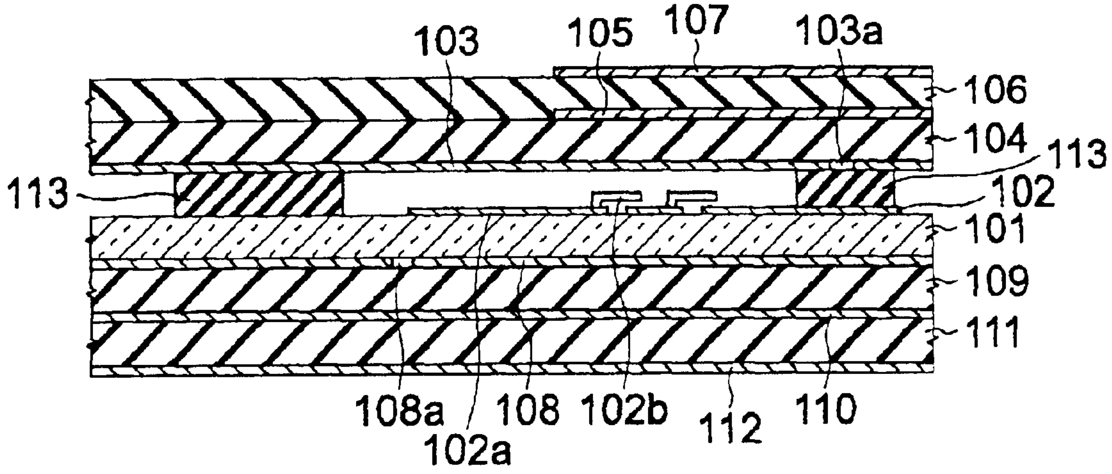

In the phased array antenna, the radiating element layer 105 and the parasitic element layer 107 are arranged on the phase control layer 102, as shown in FIG. 3. Under the phase control layer 102 is arranged the distribution/combination layer 110. In such a configuration, for example, the radiating element layer 105 has the separating layer 104 formed thereunder, and the coupling layer 103 formed of, for example, a thin Cu (copper) layer thereunder. The coupling layer 103 has the coupling slots 103*a* having slots in correspondence to the array. Similarly, the phase control layer 102 has the coupling layer 108 made of, for example, a thin Cu layer on the back thereof, and on which the coupling slots 108*a* are formed in correspondence to the array.

In such an arrangement, the phase control layer 102 has the phase shifting units, and wires X1 to Xm and Y1 to Yn for individually controlling the phase shifting units. The high-frequency signals transmitted from the power feeding section are carried to the strip lines of the distribution/combination layer 110, which are supplied to each phase shifting unit of the phase control layer 102, and at which a predetermined amount of feed phase shift is given, is carried to each radiating element of the radiating element layer 105, and is radiated from each radiating element in a predetermined direction of beam.

Subsequently, a method of manufacturing the phased array antenna as a high-frequency device in the first embodiment will be described.

First, the phase control layer 102 including the plurality of phase shifting units having the microstrip lines 102*a* and the micromachine switch 102*b* is formed on the substrate 101, as shown in FIG. 4(*a*).

On the other hand, by forming a copper film on the separating layer 109 made of a dielectric substance and producing a pattern on the copper film, the coupling layer 108 having the coupling slots 108*a* is formed on the separating layer 109, as shown in FIG. 4(*b*). By forming a film made of a conductive material such as gold on the separating layer 111 made of a dielectric substance and creating a pattern on the film, the distribution/combination layer 110 is formed on the separating layer 111. On the back of the separating layer 111, the grounding layer 112 is formed. The back of the separating layer 109 and a surface of the separating layer 111 on which the distribution/combination layer 110 is formed are brought into contact and bonded with each other, thereby forming an integrated structure.

The surface of the coupling layer 108 of the integrated structure and the back of the substrate 101 are brought into contact with each other via an adhesive film 301, and which are heated in a state in which a predetermined pressure is applied thereto, thereby bonding the surface of the coupling layer 108 to the back of the substrate 101.

Next, the spacers 113 are fixed to predetermined positions on the substrate 101, as shown in FIG. 4(*c*).

Subsequently, by forming a conductive film made of, for example, Cu and producing a pattern thereon, the coupling layer 103 having the coupling slots 103*a* is formed on the back of the separating layer 104. The radiating element layer 105 is formed on the surface of the separating layer 104. The parasitic element layer 107 is formed on the separating layer 106, and the separating layer 104 and the separating layer 106 are bonded to each other, thereby forming an integrated structure.

By fixing the integrated structure on the spacers 113, a multilayer structure in which the radiating element layer 105 and the parasitic element layer 107 are arranged on the phase control layer 102 is formed, as shown in FIG. 4(*d*).

Here, when the spacers 113 in the first embodiment is formed of a high-dielectric material, and are arranged at the coupling slots 103*a*, as shown in FIG. 2(*a*), coupling of high frequencies between the upper and the lower layers can be efficiently achieved. Also, in the first embodiment, since the spacers 113 are made of an insulating material (dielectric substance), problems such as a short circuit do not occur even when they are arranged at any portions other than portions where the micromachine switches 102*b* are formed. It is preferable to arrange the spacers such that they keep away from the strip lines. By arranging the spacers such that they keep away from the strip lines, disturbance of the transmission of the high-frequency signals can be decreased even when using the spacers.

However, when the spacers are arranged at the coupling slots 103*a*, as described above, the spacers and the strip lines overlap each other. In this case, by separately providing an impedance converter, a matching circuit, or the like, the disturbance of the transmission of the high-frequency signals can be reduced.

SECOND EMBODIMENT

Next, a second embodiment of the present invention will be described.

Figure 5:
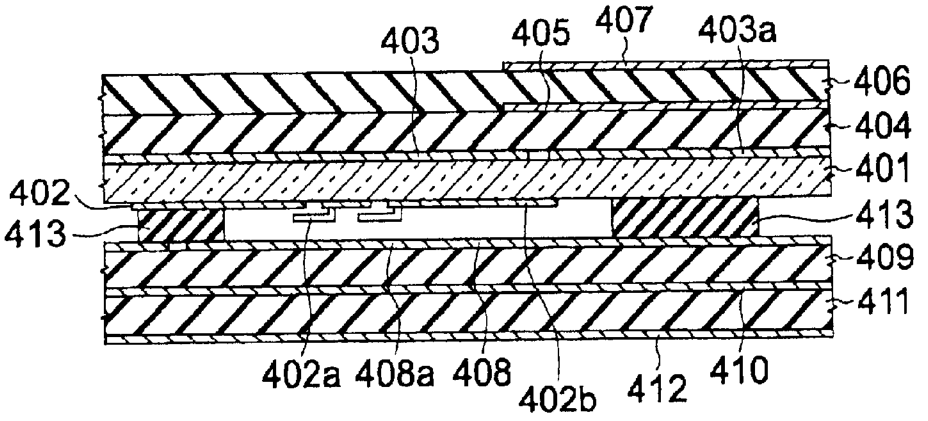
FIG. 5 is a sectional view showing a partial structure of a phased array antenna as a high-frequency device according to a second embodiment of the present invention.

In the second embodiment, a phased array antenna is formed to have a multilayer structure, as shown in a sectional view of FIG. 5. Specifically, first, a phase control layer 402 including a plurality of phase shifting units having microstrip lines 402*a* and a micromachine switch 402*b* is formed on the back of a substrate 401 made of a dielectric substance such as glass.

On the surface of the substrate 401, a radiating element layer 405 having a plurality of radiating elements is disposed via a coupling layer 403 having coupling slots 403*a* and a separating layer 404. Also, a parasitic element layer 407 having a plurality of parasitic elements is placed thereon via a separating layer 406.

Accordingly, in the second embodiment, assuming that the surface on which the radiating element layer 405 is formed is placed upper, the micromachine switch 402*b* is formed downward.

Also, a distribution/combination layer 410 including microstrip lines is disposed under the phase control layer 402 via a coupling layer 408 having coupling slots 408*a* and a separating layer 409, in which high-frequency signals transmitted from a power feeding section (not shown) are distributed to each phase shifting unit of the upper layer. In order to guide the high frequency to the microstrip lines at low loss, a grounding layer 412 made of a conductive material is provided via a separating layer 411 formed of a dielectric substance.

In the second embodiment, by arranging spacers 413 between the phase control layer 402 and a layer below it, a space is provided on the area of the phase control layer 402 at which the micromachine switches 402*b* are formed. In this case, the spacers 413 are arranged between the phase control layer 402 and the coupling layer 408 with a spacing of about 0.2 mm. In other words, a movable space of the micromachine, switches are ensured by the spacers 413, and also a sufficient distance to carry the high frequencies on the microstrip lanes 402*a* without any problems is ensured.

Subsequently, a method of manufacturing the phased array antenna which is a high-frequency device in the second embodiment will be described.

Figure 6A:
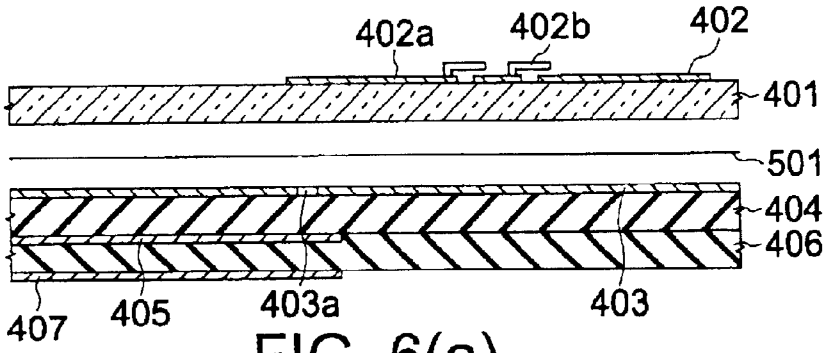
FIG. 6(*a*) is a sectional view showing a structure of the high-frequency device according to FIG. 5, when an intermediate step is finished in the process of manufacture.
Figure 6B:
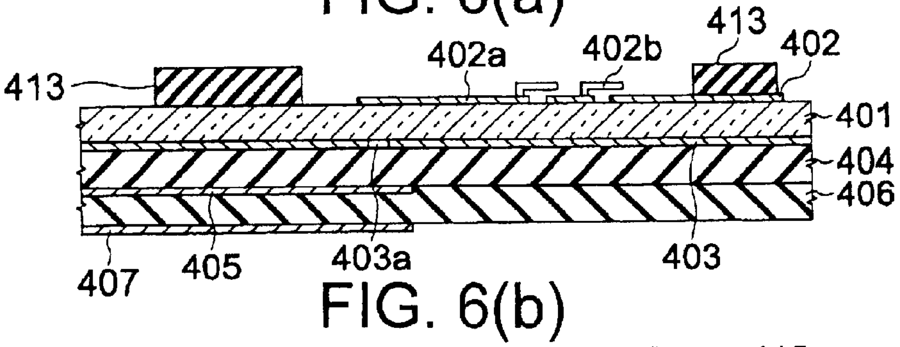
Figure 6C:
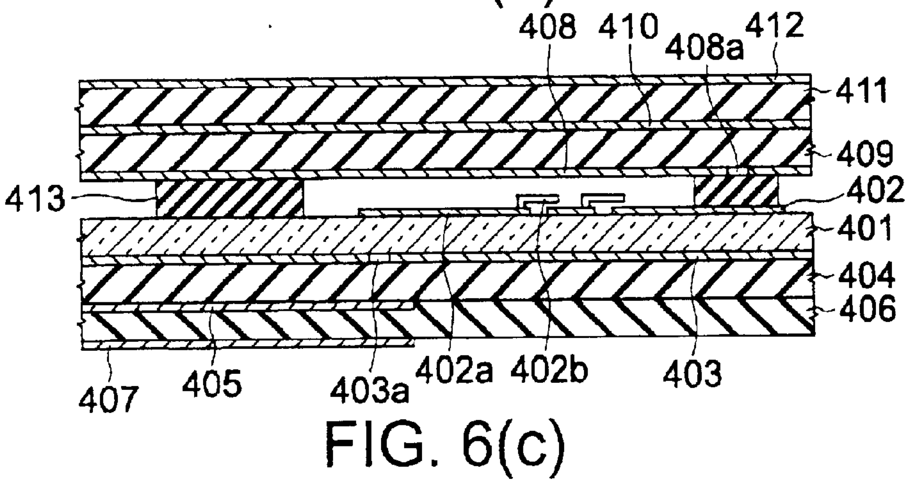

First, the phase control layer 402 including the plurality of phase shifting units having the micro-strip lines 402*a* and the micromachine switches 402*b* on one surface of the substrate 401 is formed, as shown in FIG. 6(*a*).

On the other hand, a conductive film made of, for example, Cu is formed on one surface of the separating layer 404 made of a dielectric substance, and a pattern is created thereon, thereby forming the coupling layer 403 having the coupling slots 403 on one surface of the separating layer 404.

On the other surface of the separating layer 404, the radiating element layer 405 is formed. Also, the parasitic element layer 407 is formed on the separating layer 406, and the separating layers 404 and 406 are bonded, thereby forming an integrated structure.

The surface of the coupling layer 403 of the integrated structure and the other surface of the substrate 402 are brought into contact with each other via an adhesive film 501, and which is heated in a state in which a predetermined pressure is applied thereto, thereby bonding the substrate 401 with the coupling layer 403.

Next, the spacers 413 are fixed on a surface of the substrate 401, at which the phase control layer 402 is formed, as shown in FIG. 6(*b*).

Subsequently, a copper film is formed on one surface of the separating layer 409 made of a dielectric substance, and a pattern thereof is formed, thereby forming the coupling layer 408 including the coupling slots 408*a* on one surface of the separating layer 409. Also, a film made of a conductive material such as gold is formed on one surface of the separating layer 411 made of a dielectric substance, and a pattern thereof is produced, thereby forming the distribution/combination layer 410 on one surface of the separating layer 411. On the other surface of the separating layer 411, the grounding layer 412 is formed, and the separating layer 409 and the separating layer 411 are bonded, thereby forming an integrated structure.

Such an integrated structure is fixed on the spacers 413, as shown in FIG. 6(*c*), thereby forming the multilayer structure shown in FIG. 5.

Here, as shown in the second embodiment, when the spacers 413 are made of a high-dielectric material, and are arranged at the coupling slots 408*a*, connections of the high frequencies between the upper and the lower layers can be achieved efficiently, as in the first embodiment.

When a dielectric material is used for the spacers, for example, when alumina or aluminium nitride is used, dielectric loss can be reduced. On the other hand, using glass ceramics leads to relatively low cost. Also, using barium titanate, which has a high dielectric constant, improves connection efficiency. On the other hand, it is possible to use fluorocarbon polymers, ABS resins, epoxy resin, or paper phenol, and when they are used for the spacers, the device can be manufactured at very low cost.

On the other hand, semiconductors such as silicon and GaAs may be used. Such semiconductors have a high machining performance, thereby providing high mechanical accuracy.

Also, when a pillar such as a circular cylinder or a polygonal prism is used for the spacer, it can be obtained by longitudinally cutting a plate of a predetermined thickness, so that manufacture thereof is easy. Also a spherical spacer may be used, in which a large number of spacers with a uniform size can easily be manufactured. When a sharp-pointed spacer such as a cone is used, variations in the height of individual spacers can be accommodated by altering the shape of the tip as long as the substrate being placed has high rigidity and planar accuracy.

THIRD EMBODIMENT

While the spacer is made of a dielectric material in the foregoing first and second embodiments, the invention is not limited to that. The spacer may be made of a conductive material.

Figure 7:
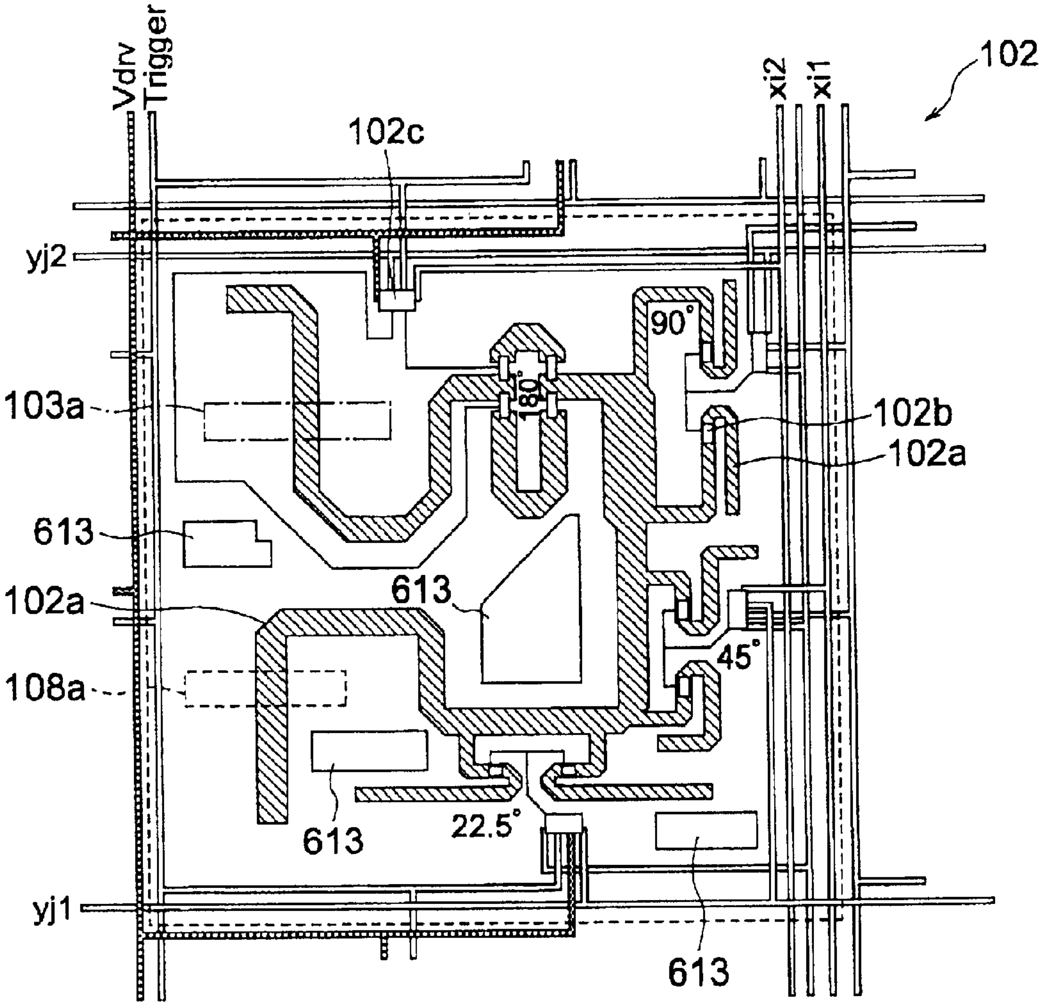
FIG. 7 is a plan view showing a partial structure of a phased array antenna as a high-frequency device according to a third embodiment of the present invention.

In this case, it is desirable that spacers 613 made of a conductive material be placed at the area of the phase control layer 102 other than the microstrip lines 102*a*, as shown in FIG. 7. In this case, it is possible to provide continuity such as grounding between the upper and the lower layers via through holes (not shown) which are separately provided in the spacers 613 and the substrate 101. Accordingly, an unnecessary mode between grounding plates, which is a parallel plate mode, can be reduced without providing means for coupling ground potentials at each layer.

When a conductive material is used as a spacer, as described above, by using a metal or alloy such as gold, silver, copper, aluminum, and brass, the effect of reducing the parallel mode is increased further, and mechanical strength of the device can be improved.

FOURTH EMBODIMENT

Next, a fourth embodiment of the present invention will be described.

Figure 8:
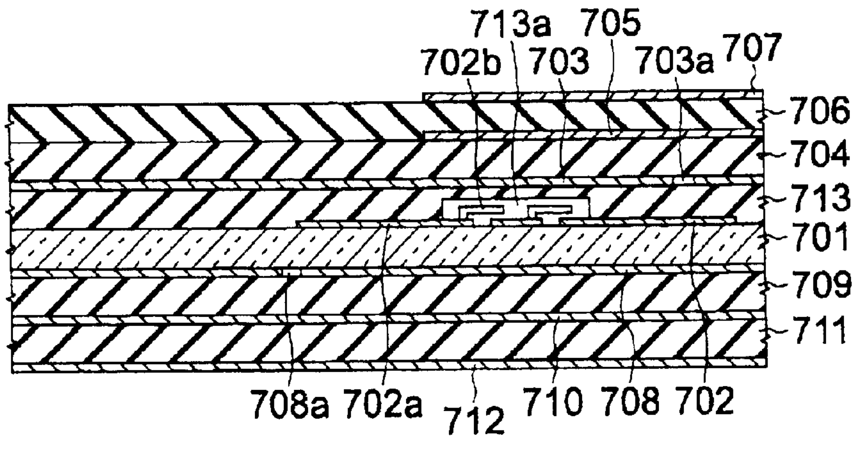
FIG. 8 is a sectional view showing a partial structure of a phased array antenna as a high-frequency device according to a fourth embodiment of the present invention.
Figure 9A:
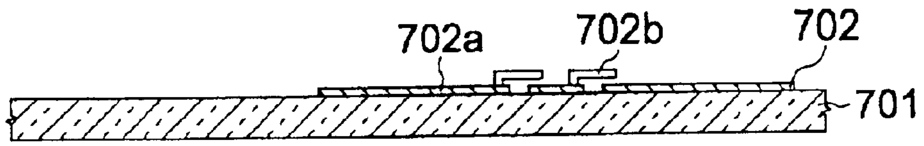
FIG. 9(*a*) is a sectional view showing a structure of the high-frequency device according to FIG. 8, when an intermediate step in the process of manufacture is finished.
Figure 9B:
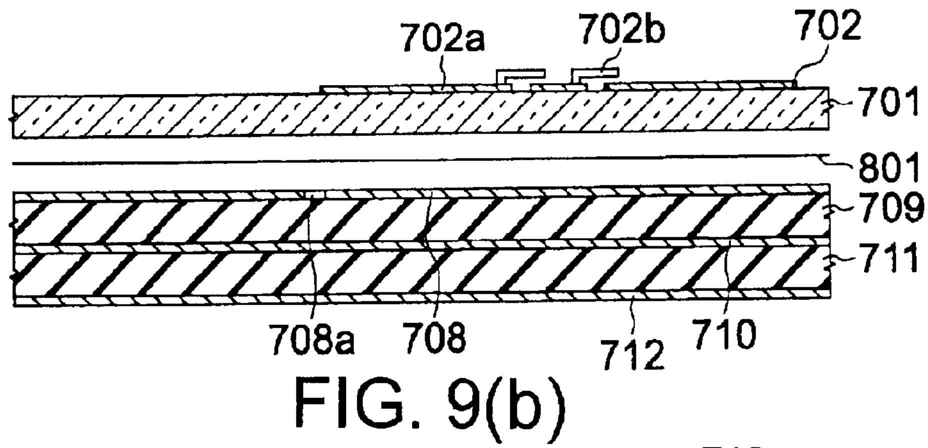
Figure 9C:
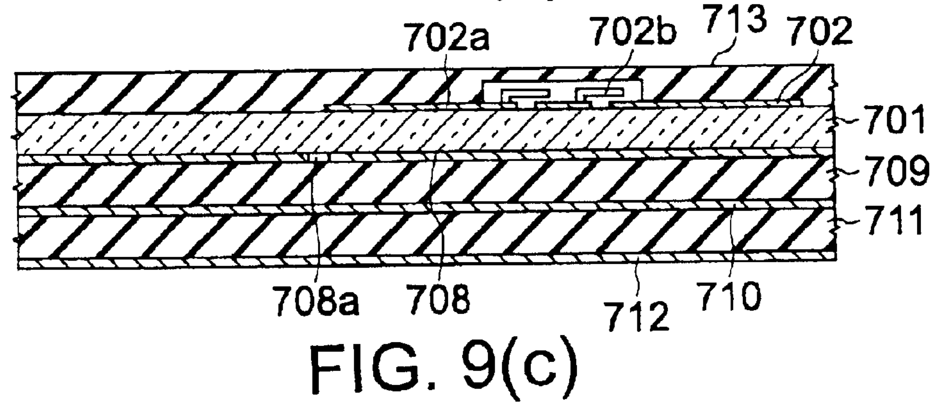
Figure 9D:
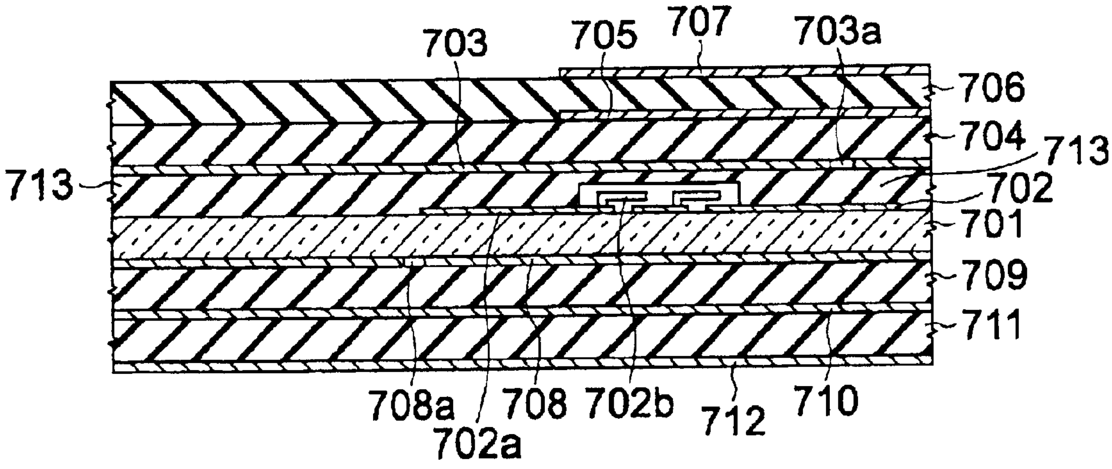

In the fourth embodiment, a phased array antenna is formed to have a multilayer structure, as shown in FIG. 8. More specifically, a phase control layer 702 formed of a plurality of phase shifting units having microstrip lines 702*a* and micromachine switches 702*b* is formed on a substrate 701 made of a dielectric substance such as glass.

On the phase control layer 702 is placed a radiating element layer 705 having a plurality of radiating elements formed thereon via a coupling layer 703 having coupling slots 703*a* and a separating layer 704. A parasitic element layer 707 having a plurality of parasitic elements is placed thereon via a separating layer 706. The parasitic elements are added to achieve a wide band, and they may be configured as necessary.

On the other hand, a distribution/combination layer 710 including microstrip lines is disposed on the back of the substrate 701 via a coupling layer 708 having coupling slots 708*a* and a separating layer 709, in which high-frequency signals transmitted from a power feeding section (not shown) are distributed to each phase shifting unit of the upper layer. In order to guide the high frequencies to the microstrip lines at low loss, a grounding layer 712 made of a conductive material is provided via a separating layer 711 formed of a dielectric substance.

In the fourth embodiment, by disposing a separating plate 713 having a space 713*a* therein between the phase control layer 702 and a layer above it, a space is provided above the area of the phase control layer 702 at which the micromachine switches 702*b* are formed. Here, the separating plate 713 is disposed between the phase control layer 702 and the coupling layer 703 with a spacing of about 0.2 mm. In other words, a movable space of the micromachine switches 702*b* is ensured by the separating plate 713, and a sufficient distance to carry the high-frequencies on the micro-strip lines 702*a* with any problems is also ensured.

Subsequently, a method of manufacturing the phased array antenna which is a high-frequency device of the fourth embodiment will be described.

Next, the phase control layer 702 including the plurality of phase shifting units having the microstrip lines 702*a* and the micromachine switches 702*b* is formed on the substrate 701, as shown in FIG. 9(*a*).

On the other hand, a copper film is formed on the separating layer 709 made of a dielectric substance, and a pattern thereof is created, thereby forming the coupling layer 708 having the coupling slots 708*a* on the coupling layer 709. Also, a film made of a conductive material such as gold is formed on the separating layer 711 made of a dielectric substance, and a pattern thereof is produced, thereby forming the distribution/combination layer 710 on the separating layer 711. On the back of the separating layer 711 is formed the grounding layer 712. The back of the separating layer 709 and a surface of the separating layer 711 on which the distribution/combination layer 719 is formed are brought into contact and bonded with each other, thereby forming an integrated structure.

The surface of the coupling layer 708 of the integrated structure and the back of the substrate 701 are brought into contact with each other via an adhesive film 801, and which is heated in a state in which a predetermined pressure is applied thereto, thereby bonding the back of the substrate 701 to the surface of the coupling layer 708, as shown in FIG. 9(*b*).

Next, the separating plate 713 is fixed on a predetermined portion on the substrate 701 such that a part where the space 713*a* is formed is on the micromachine switches 702*b*, as shown in FIG. 9(*c*).

Subsequently, a conductive film made of, for example, Cu is formed on the back of the separating layer 704 made of a dielectric substance, and a pattern thereof is formed, thereby forming the coupling layer 703 including the coupling slots 703*a* on the back of the separating layer 704. Also, on the surface of the separating layer 704 is formed the radiating element layer 705. The parasitic element layer 707 is formed on the separating layer 706, and the separating layer 704 and the separating layer 706 are bonded to each other, thereby forming an integrated structure.

Such an integrated structure is fixed on the separating plate 713, thereby forming the multilayer structure in which the radiating element layer 705 and the parasitic element layer 707 are disposed on the phase control layer 702, as shown in FIG. 9(*d*).

Figure 10A:
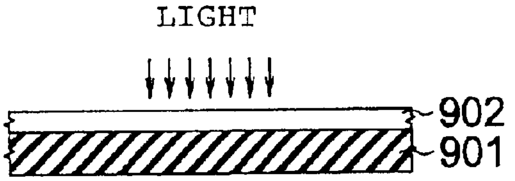
FIG. 10(*a*) is a sectional view showing a structure of a separating plate according to a fourth embodiment, when an intermediate step in the process of manufacture is finished.
Figure 10B:
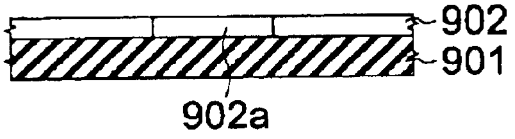

Incidentally, it is desirable that the space relative to the separating plate be formed as follows:

For example, a resin film 902 having a photosensitive property is applied and formed on a substrate 901 made of a dielectric substance and an optical image is exposed to light at a desired portion of the resin film 902, thereby forming a latent image, as shown in FIG. 10(*a*).

By developing the resin film 902, an opening 902*a* is formed at a portion corresponding to the latent image, thereby obtaining the separating plate formed of the substrate 901 and the resin film 902 and on which a space is formed by the opening 902*a*, as shown in FIG. 10(*b*).

The space may be formed by mechanically processing a desired portion of the dielectric substrate.

In addition, also when using such a separating plate having a space, the phase control layer may be formed at the opposite surface form the surface where the radiating elements are formed as in the foregoing second embodiment.

Figure 11:
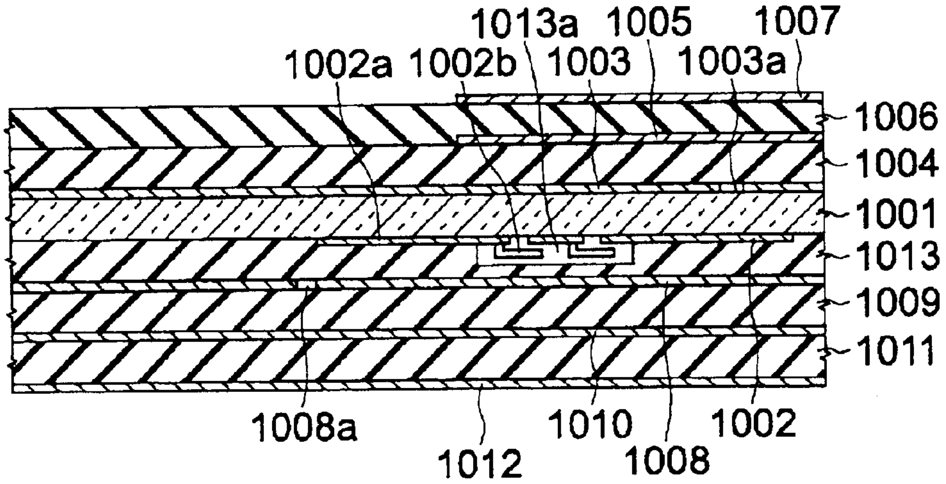
FIG. 11 is a sectional view showing a partial structure of a phased array antenna as a high-frequency device according to another embodiment of the present invention.

More specifically, first, a phase control layer 1002 including a plurality of phase shifting units having microstrip lines 1002*a* and micromachine switches 1002*b* is formed on the lower surface of a substrate 1001 made of a dielectric substance such as glass, as shown in FIG. 11.

On the upper surface of the glass substrate 1001, a radiating element layer 1005 having a plurality of radiating elements formed thereon is placed via a coupling layer 1003 having coupling slots 1003*a* and a separating layer 1004. Also, a parasitic element layer 1007 having a plurality of parasitic elements formed thereon is placed thereon via a separating layer 1006.

On the other hand, a distribution/combination layer 1010 including microstrip lines is placed under the phase control layer 1002 via a to coupling layer 1008 having coupling slots 1008*a* and a separating layer 1009, in which high-frequency signals carried from a power feeding section (not shown) are distributed to each phase shifting unit of the upper layer. In order to guide the high frequencies to the microstrip lines at low loss, a grounding layer 1012 made of a conductive material is provided via a separating layer 1011 made of a dielectric substance.

By arranging a separating plate 1013 having a space 1013*a* between the phase control layer 1002 and a layer below it, a space is provided on the area of the phase control layer 1002 at which the micromachine switches 1002*b* are formed. In this case, the separating plate 1013 is disposed between the phase control layer 1002 and the coupling layer 1008 with a spacing of about 0.2 mm. In other words, in this case as well, a movable space of the micromachine switches 1002*b* is ensured by the separating plate 1013, and also a sufficient distance carry the high frequencies on the microstrip lines 1002*a* without any problems is ensured.

When alumina or aluminium nitride is used as a material of the separating plate, dielectric loss can be reduced. On the other hand, using glass ceramics leads to relatively low cost. Also, it is possible to use fluorocarbon polymers, ABS resins, epoxy resin, paper phenol, and so on, so that the device can be manufactured at very low cost.

INDUSTRIAL APPLICABILITY

As described above, the high-frequency device according to the present invention is a device, such as a phased array antenna used for transmitting and receiving high-frequency signals such as a microwave, which transmits high-frequency signals, and more particularly, which is applicable to high-frequency band with high-gain and is capable of using such a switch having movable parts as a micromachine switch, and to a method of manufacturing the same.

What is claimed is:

1. A high-frequency device comprising:

a substrate made of a dielectric substance;

a plurality of waveguides for carrying high-frequency signals formed on the substrate;

plural switches formed on the substrate and having movable parts, each switch for switching into service an associated one of said plural waveguides;

a structure disposed on the substrate and having a space above the area where the switch is formed;

at least one spacer for forming the space in the structure;

a coupling layer made of a conductive material, formed on the structure, and having coupling means for coupling high-frequency signals on a predetermined area of the waveguides;

a separating layer made of a dielectric material and formed on the coupling layer;

high-frequency parts formed on the separating layer and in which the high-frequency signals are coupled between them and the waveguides via the coupling means; and control means for controlling the operation of the plural switches, wherein the spacer is made of a dielectric substance and is arranged at least at the part of the coupling means.

2. A high-frequency device comprising:

a substrate made of a dielectric substance;

a plurality of waveguides for carrying high-frequency signals formed on the substrate;

plural switches formed on the substrate and having movable parts, each switch for switching into service an associated one of said plural waveguides;

a structure disposed on the substrate and having a space above the area where the switch is formed;

at least one spacer for forming the space in the structure;

a coupling layer made of a conductive material, formed on the structure, and having coupling means for coupling high-frequency signals on a predetermined area of the waveguides;

a separating layer made of a dielectric material and formed on the coupling layer;

high-frequency parts formed on the separating layer and in which the high-frequency signals are coupled between them and the waveguides via the coupling means; and control means for controlling the operation of the plural switches, wherein the spacer is made of a conductive substance and is arranged such that it is insulated from the waveguides.

3. The high-frequency device according to claim 1, wherein the structure is formed of an integrated plate having the space formed therein.

4. The high-frequency device according to claim 1, wherein a phase shifter is made up of the waveguides and the switch.

5. The high-frequency device according to claim 4, wherein the high-frequency parts include radiating elements.

6. The high-frequency device according to claim 5, comprising a distributor for introducing a desired high frequency to the waveguides.

7. The high-frequency device according to claim 2, wherein the structure is formed of an integrated plate having the space formed therein.

8. A method of manufacturing a high-frequency device, comprising the steps of:

forming a plurality of waveguides for carrying high-frequency signals on a substrate made of a dielectric substance;

forming plural switches having movable parts on the substrate, each switch for switching into service an associated one of said plural waveguides;

forming a structure on the substrate, the structure having at least one spacer for forming a space above the area where the switch is formed;

forming a coupling layer on the structure having coupling means for coupling high-frequency signals such that the coupling means is placed on a predetermined area of the waveguides, the coupling layer being made of a conductive material;

forming a separating layer made of a dielectric material on the coupling layer;

forming high-frequency parts on the separating layer, in which high-frequency signals are coupled between them and the waveguides via the coupling means; and forming control means for controlling the operation of the plural switches, wherein the spacer is formed of a dielectric substance and is placed at least at the part of the coupling means.

9. A method of manufacturing a high-frequency device, comprising the steps of:

forming a plurality of waveguides for carrying high-frequency signals on a substrate made of a dielectric substance;

forming plural switches having movable parts on the substrate, each switch for switching into service an associated one of said plural waveguides;

forming a structure on the substrate, the structure having at least one spacer for forming a space above the area where the switch is formed;

forming a coupling layer on the structure having coupling means for coupling high-frequency signals such that the coupling means is placed on a predetermined area of the waveguides, the coupling layer being made of a conductive material;

forming a separating layer made of a dielectric material on the coupling layer;

forming high-frequency parts on the separating layer, in which high-frequency signals are coupled between them and the waveguides via the coupling means; and forming control means for controlling the operation of the plural switches, wherein the spacer is formed of a conductive substance and is arranged such that it is insulated from the waveguides.

10. The high-frequency device according to claim 8, wherein the structure has an integrated plate having the space formed therein.

11. The high-frequency device according to claim 9, wherein the structure has an integrated plate having the space formed therein.

12. A high-frequency device having a high-frequency circuit installed on a multilayer substrate, comprising:

an inner layer substrate forming the multilayer substrate;

a plurality of waveguides for carrying high-frequency signals formed on a main surface of the inner layer substrate;

plural switches having movable parts, each switch for switching into service an associated one of said plural waveguides formed on the main surface of the inner layer substrate; and a structure disposed between the main surface of the inner layer substrate and a substrate placed thereon and having at least one spacer for forming a space above the area where each switch is formed, wherein the spacer is formed of a dielectric substance and is arranged at least at a part of coupling means for the waveguides.

13. A high-frequency device in which a high-frequency circuit is installed on a multilayer substrate, the device comprising:

an inner layer substrate forming the multilayer substrate;

a plurality of waveguides for carrying high-frequency signals formed on a main surface of the inner layer substrate;

plural switches having movable parts, each switch for switching into service an associated one of said plural waveguides formed on the main surface of the inner layer substrate; and a structure disposed between the main surface of the inner layer substrate and a substrate placed thereon and having at least one spacer for forming a space above the area where each switch is formed, wherein the spacer is formed of a conductive substance and is arranged such that it is insulated from the waveguides.

14. The high-frequency device according to claim 12, wherein the structure is formed of an intergrated plate having the space formed therein.

15. The high-frequency device according to claim 13, wherein the structure is formed of an intergrated plate having the space formed therein.

* * * * *